(12) United States Patent
Saeki et al.

(10) Patent No.: US 7,492,038 B2
(45) Date of Patent: Feb. 17, 2009

(54) SEMICONDUCTOR DEVICE

(75) Inventors: Yoshihiro Saeki, Tokyo (JP); Shinji Hiratsuka, Tokyo (JP); Daigo Chabata, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 10/760,359

(22) Filed: Jan. 21, 2004

(65) Prior Publication Data

US 2005/0127526 A1 Jun. 16, 2005

(30) Foreign Application Priority Data

Nov. 19, 2003 (JP) ............................. 2003-389483

(51) Int. Cl.
*H01L 23/02* (2006.01)
(52) U.S. Cl. ...................................... 257/686
(58) Field of Classification Search ................ 257/686, 257/724–728, 777, 734, E23.499
See application file for complete search history.

(56) References Cited

U.S. PATENT DOCUMENTS

| | | | | |
|---|---|---|---|---|
| 5,644,167 | A * | 7/1997 | Weiler et al. | 257/777 |
| 6,222,260 | B1 * | 4/2001 | Liang et al. | 257/691 |
| 6,255,729 | B1 * | 7/2001 | Oikawa | 257/723 |
| 6,396,154 | B1 * | 5/2002 | Hikita et al. | 257/778 |
| 6,424,034 | B1 * | 7/2002 | Ahn et al. | 257/723 |
| 6,580,163 | B2 * | 6/2003 | Poulin | 257/678 |
| 6,580,164 | B1 | 6/2003 | Ohie | |
| 6,762,486 | B2 * | 7/2004 | Inoue et al. | 257/686 |
| 6,777,801 | B2 * | 8/2004 | Ohie | 257/690 |
| 6,791,127 | B2 * | 9/2004 | Nunokawa | 257/203 |
| 6,798,071 | B2 * | 9/2004 | Kawaishi | 257/777 |
| 6,879,023 | B1 * | 4/2005 | Gutierrez | 257/547 |
| 2004/0000706 | A1 * | 1/2004 | Tanaka et al. | 257/686 |
| 2004/0018662 | A1 * | 1/2004 | Goto | 438/109 |
| 2004/0150089 | A1 * | 8/2004 | Inoue et al. | 257/685 |
| 2004/0150090 | A1 * | 8/2004 | Inoue et al. | 257/686 |
| 2004/0262775 | A1 * | 12/2004 | Ohie | 257/777 |
| 2005/0146014 | A1 * | 7/2005 | Gutierrez | 257/691 |

FOREIGN PATENT DOCUMENTS

JP 2001-267488 9/2001

\* cited by examiner

*Primary Examiner*—Nathan W Ha
(74) *Attorney, Agent, or Firm*—Studebaker & Brackett PC; Donald R. Studebaker

(57) ABSTRACT

A semiconductor device according to the present invention comprises, on a first semiconductor chip, a first circuit element region in which a first electrode group is arranged along an outer periphery of the first semiconductor chip in such a manner as to surround a second semiconductor chip, a second electrode group is arranged along the outer periphery of the first semiconductor chip in such a manner as to surround the first electrode group, and the first semiconductor chip is surrounded by the first electrode group, and a second circuit element region which surrounds the first electrode group and is surrounded by the second electrode group.

22 Claims, 1 Drawing Sheet

SEMICONDUCTOR DEVICE

BACKGROUND OF THE INVENTION

1. Field of the Invention

The present invention relates to a multiple chip package (MCP) type semiconductor device in which a plurality of semiconductor chips are mounted in one package.

2. Description of the Related Art

In a conventional MCP type semiconductor device, as described in, for example, Patent Document 1, a second semiconductor chip is mounted on a first semiconductor chip. On the first semiconductor chip, first electrodes and second electrodes are formed, and on the second semiconductor chip, third electrodes are formed.

The plurality of first electrodes are provided along an outer periphery of the first semiconductor chip, and the plurality of the second electrodes are arranged between the outer periphery of the first semiconductor chip and the first electrodes and along the outer periphery of the first semiconductor chip.

Furthermore, the first electrodes and the third electrodes are electrically connected to each other by wires, and the second electrodes are electrically connected by wires to leads which are electrically connected to an external board etc.

The first semiconductor chip and the second semiconductor chip are sealed with a resin.

Patent Document 1: Japanese Patent Application Laid-open No. 2001-267488

In a semiconductor device described in Patent Document 1, wires for electrically connecting first electrodes and third electrodes to each other are positioned above a first semiconductor chip, and hence circuit elements formed on the first semiconductor chip are subject to an influence of noise generated from the wires, with the result that the reliability of the semiconductor device is liable to deteriorate.

Especially in a case where circuit elements easily subject to an influence of noise such as analog circuit elements are arranged as the circuit elements formed on the first semiconductor chip which is positioned directly below the wires where they may be easily subject to noise influence, the circuit elements on the first semiconductor chip are liable to be subject to the noise influence significantly.

SUMMARY OF THE INVENTION

The present invention is directed to a semiconductor device comprising a first semiconductor chip; a second semiconductor chip which is mounted on the first semiconductor chip; a first electrode group which is formed on the first semiconductor chip and arranged along an outer periphery of the first semiconductor chip in such a manner as to surround the second semiconductor chip; a second electrode group which is formed on the first semiconductor chip and arranged along the outer periphery of the first semiconductor chip in such a manner as to surround the first electrode group; a third electrode group which is formed on the second semiconductor chip; a plurality of first wires for electrically connecting the first electrode group and the third electrode group to each other; and external connection terminals which are electrically connected to the second electrode group, wherein the first semiconductor chip comprises a first circuit element region which is surrounded by the first electrode group, and a second circuit element region which surrounds the first electrode group and is surrounded by the second electrode group.

In a semiconductor device according to the present invention, a first semiconductor chip comprises a second circuit element region which surrounds a first electrode group and is surrounded by a second electrode group, that is, it comprises a circuit element region directly above which wires electrically connecting the first electrode group and a third electrode group to each other are not present, so that it is possible to arrange in the second circuit element region circuit elements easily subject to an influence of noise such as analog circuit elements, thereby suppressing an influence of noise generated from the wires on the circuit elements on the first semiconductor chip.

Thus, it is possible to remarkably improve the reliability of a semiconductor device in which a first semiconductor chip and a second semiconductor chip are mounted.

DESCRIPTION OF THE PREFERRED EMBODIMENTS

Figure 1:
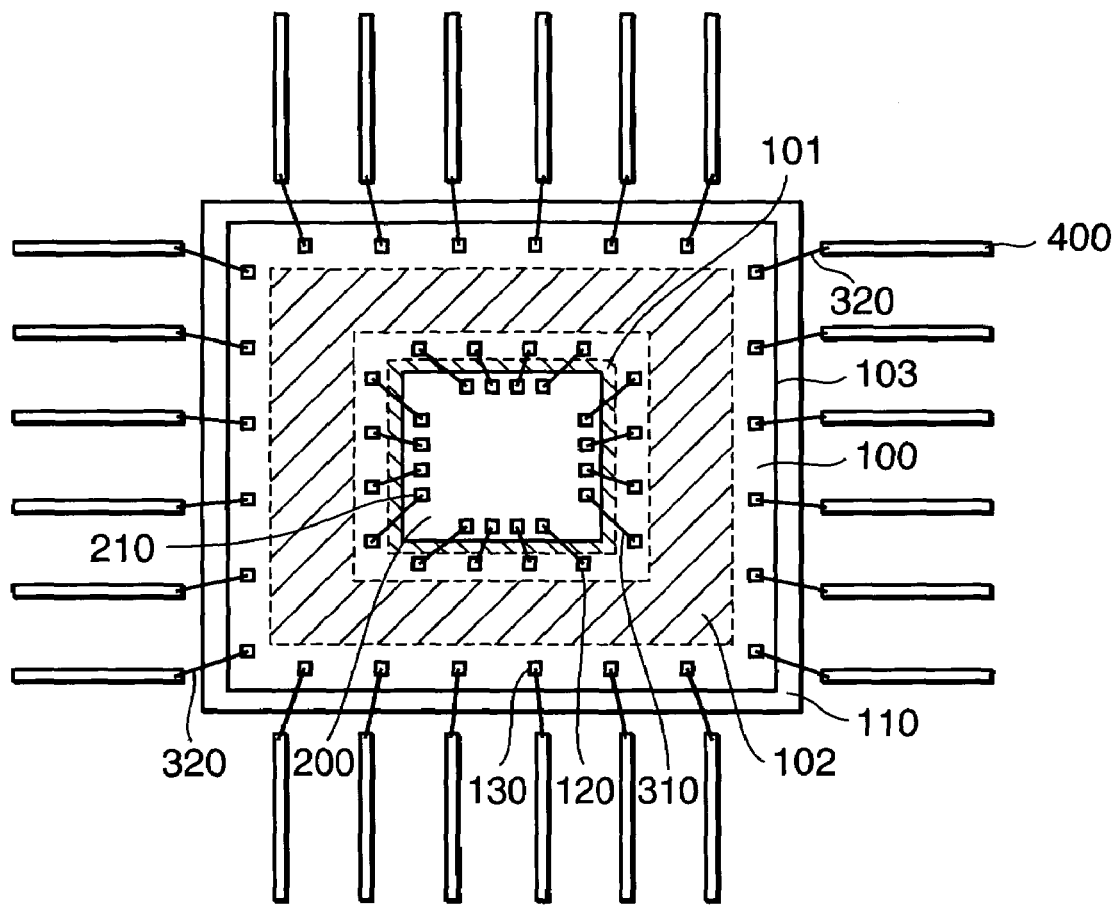
FIG. 1 is a plan view of a semiconductor device according to an embodiment of the present invention.

The following will describe in detail embodiments of the present invention with reference to drawings. Like components in these drawings are indicated by like reference numerals.

An embodiment of the present invention is described below with reference to FIGS. 1 and 2. FIG. 1 is a plan view of a semiconductor device related to the present embodiment and FIG. 2, a cross-sectional view of the same semiconductor device.

Figure 2:
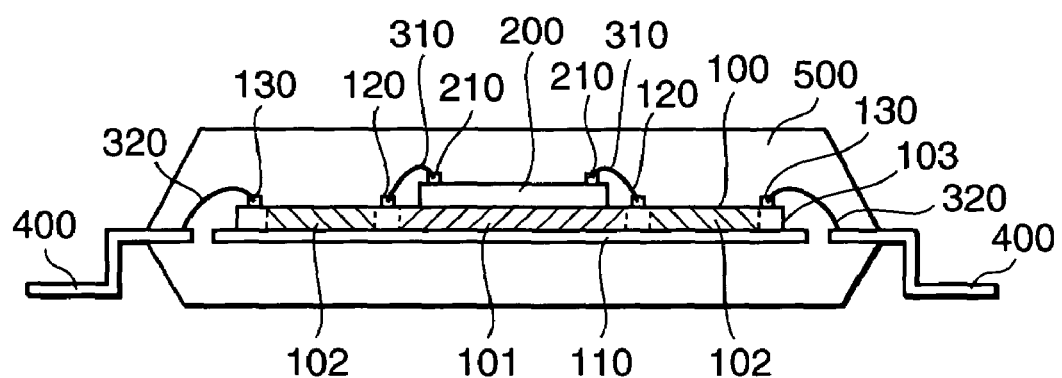
FIG. 2 is a cross-sectional view of the semiconductor device according to the embodiment of the present invention.

As shown in FIGS. 1 and 2, the semiconductor device according to the present embodiment comprises a first semiconductor chip 100 and a second semiconductor chip 200 mounted on the first semiconductor device 100.

In the present embodiment, the first semiconductor chip 100 is adhered and fixed onto a support 110 with an adhesive agent etc. The first semiconductor chip 100 and the second semiconductor chip 200 each have a substrate made of silicon, on which substrate circuit elements are formed.

Since the second semiconductor chip 200 is mounted on the first semiconductor chip 100, a semiconductor device in which the first semiconductor chip 100 and the second semiconductor chip 200 are mounted can be fit onto an external board etc. in a significantly decreased fitting area.

Furthermore, in the present embodiment, a size of the second semiconductor chip 200 is smaller than that of the first semiconductor chip 100, so that an outer periphery of the second semiconductor chip 200 is positioned closer to a midpoint than an outer periphery 103 of the first semiconductor chip 100.

It is thus possible to adhere a back surface of the second semiconductor chip 200 thoroughly to an upper surface of the first semiconductor chip 100, thereby mounting the second semiconductor chip 200 on the first semiconductor chip 100 in a stable condition.

Furthermore, on the first semiconductor chip 100, a first electrode group 120 is arranged along the outer periphery 103 of the first semiconductor chip 100 in such a manner as to surround the second semiconductor chip 200 and a second electrode group 130 is arranged along the outer periphery 103 of the first semiconductor chip 100 in such a manner as to surround the first electrode group 120.

The first electrode group 120 and the second electrode group 130 are each connected electrically to circuit elements formed on the first semiconductor chip 100.

In the present embodiment, the first electrode group 120 and the second electrode group 130 are each formed along sides of the outer periphery 103 of the first semiconductor chip 100.

Furthermore, a third electrode group 210 is formed on the second semiconductor chip 200.

The third electrode group 210 is electrically connected to circuit elements formed on the second semiconductor chip 200.

In the present embodiment, the third electrode group 210 is formed along sides of the outer periphery of the semiconductor chip 200.

Furthermore, the first electrode group 120 and the third electrode group 210 are electrically connected to each other by a plurality of conductive wires 310.

In such a manner, the circuit elements formed on the first semiconductor chip 100 are electrically connected to the circuit elements formed on the second semiconductor chip 200.

Furthermore, the second electrode group 130 is electrically connected to external connection terminals 400 which are electrically connected to an external board etc.

In the present embodiment, the external connection terminals 400 are a plurality of conductive leads 400, which are arranged along the outer periphery 103 of the first semiconductor chip 100 at positions separate from the first semiconductor chip 100 by a predetermined distance and which are electrically connected to the second electrode group 130 by a plurality of conductive wires 320.

It is thus possible to electrically connect the circuit elements formed on the first semiconductor chip 100 and the leads 400 to each other.

In the present embodiment, the leads 400 are provided in such a manner as to surround the outer periphery 103 of the semiconductor chip 100.

Furthermore, the first semiconductor chip 100 comprises a first circuit element region 101 which is surrounded by the first electrode group 120 and a second circuit element region which surrounds the first electrode group 120 and is surrounded by the second electrode group 130.

That is, the first semiconductor chip 100 comprises the first circuit element region 101 and the second circuit element region 102 positioned between the first circuit element region 101 and the outer periphery 103, in such a layout that the first electrode group 120 is positioned between the first circuit element region 101 and the second circuit element region 102 and the second electrode group 130 is positioned between the second circuit element region 102 and the outer periphery 103.

Furthermore, the first semiconductor chip 100 and the second semiconductor chip 200 are sealed with a resin 500. This resin 500 seals the wires 310 and 320 and surfaces of the first electrode group 120, the second electrode group 130, and the third electrode group 210.

It is thus possible to lower a probability that any one of the wires is flexed by an external impact etc. and comes in contact with another adjacent to it or that the wires and the electrodes are affected by moisture.

It is to be noted that the leads 400 are sealed with the resin 500 at locations where they are connected to the wires 320 and one end of each of the leads 400 is exposed from the resin 500. At locations where they are exposed from the resin 500, the leads 400 are connected to an external board etc.

As can be seen from the above, in a semiconductor device according to the present embodiment, the first semiconductor chip 100 comprises the second circuit element region which surrounds the first electrode group 120 and is surrounded by the second electrode group 130, that is, it comprises a circuit element region directly above which the wires 310 electrically connecting the first electrode group 120 and the third electrode group 210 to each other are not present, so that it is possible to arrange circuit elements easily subject to an influence of noise such as analog circuit elements in the second circuit element region 102, thereby suppressing an influence of noise generated from the wires 310 on the circuit elements on the first semiconductor chip 100.

It is thus possible to remarkably improve the reliability of a semiconductor device in which the first semiconductor chip 100 and the second semiconductor chip 200 are mounted.

Furthermore, the second circuit element region 102 is provided between the first electrode group 120 and the second electrode group 130, so that some of the circuit elements conventionally arranged closer to a midpoint than the second electrode group can be arranged in the second circuit element region 102 in a semiconductor device according to the present embodiment.

It is thus possible to reduce an area of the circuit elements which are arranged closer to the midpoint than the first electrode group 120, thereby bringing the first electrode group 120 close to the second semiconductor chip 200.

That is, it is possible to reduce a distance between the first electrode group 120 and the second semiconductor chip 200.

It is possible to shorten the wires 310 which electrically connect the first electrode group 120 and the third electrode group 210 to each other. Accordingly, there can be reduced a possibility that the wire 310 is pushed and shifted by the resin 500 at the time of the resin sealing and it comes in contact with an adjacent wire 310. In consequence, the reliability of the semiconductor device sealed with the resin can remarkably be improved.

Furthermore, by shortening the wires 310, a height of the wires 310 can also be decreased, thereby thinning the semiconductor device sealed with the resin.

Especially, in a case where the second semiconductor chip 200 is remarkably smaller than the first semiconductor chip 100, wires electrically connecting the first semiconductor chip and the second semiconductor chip to each other have conventionally been elongated, and so the wires have been liable to be pushed and shifted by the resin at the time of the resin sealing.

According to the present embodiment, even in such a semiconductor device, that is, a semiconductor device in which the second semiconductor chip 200 is much smaller than the first semiconductor chip 100, the wires 310 can be shortened, whereby the reliability of the semiconductor device sealed with the resin can remarkably be improved.

What is claimed is:

1. A semiconductor device comprising:
   a first semiconductor chip;
   a second semiconductor chip which is mounted on the first semiconductor chip;
   a first electrode group which is located on the first semiconductor chip so as to be arranged along an outer periphery of the second semiconductor chip;
   a second electrode group which is located on the first semiconductor chip so as to be arranged along an outer periphery of the first semiconductor chip, wherein the second electrode group surrounds the first electrode group;
   a third electrode group which is located on the second semiconductor chip;
   a plurality of first wires for electrically connecting the first electrode group and the third electrode group to each other;

external connection terminals which are located around the first semiconductor chip; and a plurality of second wires for electrically connecting the second electrode group and the external connection terminals, wherein, the first semiconductor chip has a first circuit element area on which the second semiconductor chip is mounted and a second circuit element area which is positioned between the first electrode group and the second electrode group, and wherein the second semiconductor chip includes a memory circuit and the second circuit element area includes a logic circuit which are susceptible to influence of noise caused outside the the logic circuit controlling the memory circuit.

2. The semiconductor device according to claim 1, wherein:

the external connection terminals are conductive leads;

the plurality of leads are arranged along the outer periphery of the first semiconductor chip at positions separate from the first semiconductor chip by a predetermined distance; and the second electrode group and the leads are electrically connected to each other by a plurality of second wires.

3. The semiconductor device according to claim 1, wherein a size of the second semiconductor chip is smaller than that of the first semiconductor chip.

4. The semiconductor device according to claim 1, wherein the first semiconductor chip and the second semiconductor chip are sealed with a resin.

5. The semiconductor device according to claim 4, wherein a distance between an upper surface of the second semiconductor chip and an upper surface of the resin is greater than a thickness of the second semiconductor chip.

6. The semiconductor device according to claim 1, wherein:

the external connection terminals are conductive leads;

the plurality of leads are arranged along the outer periphery of the first semiconductor chip at positions separate from the first semiconductor chip by a predetermined distance;

the second electrode group and the leads are electrically connected to each other by a plurality of second wires;

the first semiconductor chip and the second semiconductor chip are sealed with a resin; and the first wires and the second wires are sealed with the resin.

7. The semiconductor device according to claim 1, wherein the first semiconductor chip is formed on a support.

8. The semiconductor device according to claim 1, wherein the first electrode group and the second electrode group are located along sides of the outer periphery of the first semiconductor device.

9. The semiconductor device according to claim 1, wherein the third electrode group is located along the outer periphery of the second semiconductor chip.

10. The semiconductor device according to claim 1, wherein a size of the second semiconductor chip is smaller than that of the central circuit area of the first semiconductor chip.

11. The semiconductor device according to claim 1, wherein the circuit elements susceptible to the influence of noise are analog circuit elements.

12. A semiconductor device comprising:

a first semiconductor chip having a first circuit element region and a second circuit element region which is apart from the first circuit element region, and further having an intermediate region which is positioned between the first circuit element region and the second circuit element region, wherein the second circuit element region includes a logic circuit which are susceptible to influence of noise caused outside the logic circuit;

a plurality of first electrodes which are located on the first semiconductor chip;

a plurality of second electrodes which are located on the first semiconductor chip and between the second circuit element region and an outer periphery of the first semiconductor chip, so that the second circuit element region is positioned between the first electrodes and the second electrodes;

a second semiconductor chip which is mounted in the first circuit element region of the first semiconductor chip, wherein the second semiconductor chip includes a memory circuit which is controlled by the logic circuit in the second circuit element region;

a plurality of third electrodes which are located on the second semiconductor chip;

a plurality of first wires which electrically connects the first electrodes and the third electrodes to each other;

external connection terminals which are located along the outer periphery of the first semiconductor chip so that the second electrodes are positioned between the second circuit element region and the external connection terminals; and a plurality of second wires which electrically connects the second electrodes and the external connection terminals.

13. The semiconductor device according to claim 12, wherein a size of the second semiconductor chip is smaller than that of the central circuit area of the first semiconductor chip.

14. The semiconductor device according to claim 12, wherein the circuit elements susceptible to the influence of noise are analog circuit elements.

15. The semiconductor device according to claim 12, wherein the first and second semiconductor chips are sealed with a resin.

16. A semiconductor device comprising:

a first semiconductor chip having a first circuit element area, a second circuit element area surrounding the first circuit element area, a first electrode area positioned between the first circuit element area and the second circuit element area so as to surround the first circuit element area, and a second electrode area positioned at outside of the second circuit element area so as to surround the second circuit element area;

a second semiconductor chip mounted on the first circuit element area of the first semiconductor chip, wherein the second semiconductor chip includes a memory circuit and the second circuit element area includes a logic circuit which are susceptible to influence of noise caused outside the logic circuit controlling the memory circuit;

a plurality of first electrodes located on the first electrode area of the first semiconductor chip;

a plurality of second electrodes located on the second electrode area of the first semiconductor chip;

a plurality of third electrodes located on the second semiconductor chip;

a plurality of first bonding wires for electrically connecting the first electrodes and the third electrodes, respectively;

a plurality of external connection terminals electrically connected to the second electrodes, respectively; and a plurality of second bonding wires for electrically connecting the second electrodes and the external connection terminals.

17. The semiconductor device according to claim 16, wherein a size of the second semiconductor chip is smaller than that of the central circuit area of the first semiconductor chip.

18. The semiconductor device according to claim 16, wherein the circuit elements susceptible to the influence of noise are analog circuit elements.

19. The semiconductor device according to claim 16, wherein the first and second semiconductor chips are sealed with a resin.

20. The semiconductor device according to claim 19, wherein a distance between an upper surface of the second semiconductor chip and an upper surface of the resin is greater than a thickness of the second semiconductor chip.

21. The semiconductor device according to claim 16, wherein the electrical connections are a plurality of wires.

22. The semiconductor device according to claim 16, wherein external connection terminals are electrically connected to the second electrodes by a plurality of wires.

* * * * *